United States Patent [19]
Kaiser et al.

[11] Patent Number: 6,054,766
[45] Date of Patent: Apr. 25, 2000

[54] PACKAGE FOR ENCLOSING MICROOPTICAL AND/OR MICROELECTRONIC DEVICES SO AS TO MINIMIZE THE LEAKAGE OF MICROWAVE ELECTROMAGNETIC RADIATION

[75] Inventors: Detlev Kaiser, Wallenhorst; Hans-Peter Hirler, Weilheim, both of Germany

[73] Assignee: Alcatel, Paris, France

[21] Appl. No.: 09/036,451

[22] Filed: Mar. 6, 1998

[30] Foreign Application Priority Data

Mar. 6, 1997 [DE] Germany .......................... 197 09 042

[51] Int. Cl.⁷ ..................................................... H01L 23/34
[52] U.S. Cl. ............................ 257/728; 257/659; 257/660
[58] Field of Search ..................................... 257/659, 705, 257/728, 660; 333/22 R, 81 A, 81 B; 342/1–4; 385/139, 140

[56] References Cited

U.S. PATENT DOCUMENTS

| | | |
|---|---|---|
| 4,240,087 | 12/1980 | Krause et al. . |
| 5,185,654 | 2/1993 | Mosher et al. . |
| 5,309,321 | 5/1994 | Olla et al. . |
| 5,406,240 | 4/1995 | Deckers . |
| 5,515,009 | 5/1996 | Wong et al. . |
| 5,578,890 | 11/1996 | Vig . |

FOREIGN PATENT DOCUMENTS

| | | |
|---|---|---|
| 0001890 | 6/1979 | European Pat. Off. . |
| 0837502 | 4/1998 | European Pat. Off. . |
| 19609718 | 6/1997 | Germany . |

OTHER PUBLICATIONS

Patent Abstracts of Japan, vol. 014, No. 328 (E–0952), Jul. 13, 1990 and JP 02 109401 A (Fujitsu Ltd), 23, Apr. 1990.

Patent Abstracts of Japan, vol. 016, No. 321 (M–1279), Jul. 14, 1992 & JP 04 091846 A (Nippon Shokubia Co Ltd), Mar. 25, 1992.

Patent Abstracts of Japan, vol. 015, No. 330 (E–1103), Aug. 22, 1991 & JP 03 124050 A (Sharp Corp) May 27, 1991.

Bierman, H: "Microwave Packages are Meeting GAAS Challenges", Microwave Journal, Bd. NR 11, Nov. 1, 1986, pp. 26, 28, 31/32, 34.

Yook J—G et al, "Experimental and Theoretical Study of Parasitic Leakage/Resonance in a K/KA–Band MMIC Package" IEEE Trans Microwave Theory, 1, Dec. 1996, pp. 2403–2409.

NI T–D et al: "High Frequency Hermetic Packages Using LTCC" 1996 IEEE MIT–S Int'l Symp. San Francisco, Jun. 17–21, 1996, pp. 1627–1630.

Patent Abstracts of Japan, vol. 097, No. 009, Sep. 30, 1997, & JP 09 116301 A (NEC Corp), May 2, 1997.

*Primary Examiner*—Sheila V. Clark
*Attorney, Agent, or Firm*—Ware, Fressola, Van Der Sluys & Adolphson LLP

[57] ABSTRACT

The invention relates to a package for microoptical and/or microelectronic devices. The package is to be designed in such a way that package resonances initiated by standing waves produced in the package are completely avoided or very highly attenuated. This is achieved by making the package, in whole or in part, of a microwave-absorbing, nonoutgassing material. A suitable material is silicon or graphite, for example.

4 Claims, No Drawings

PACKAGE FOR ENCLOSING MICROOPTICAL AND/OR MICROELECTRONIC DEVICES SO AS TO MINIMIZE THE LEAKAGE OF MICROWAVE ELECTROMAGNETIC RADIATION

TECHNICAL FIELD

This invention relates to a package for microoptical/or microelectronic devices.

BACKGROUND OF THE INVENTION

If electronic and/or optoelectronic circuits housed in a package are operated at frequencies in the GHZ range, part of the microwave power may leak as electromagnetic radiation. The resulting electromagnetic waves are nearly completely reflected at the inner surfaces of metallic package walls. The package, depending on its internal dimensions, forms a resonant circuit which shows an undesirable resonance effect at given frequencies. Test measurements on a package designed to house electrical or optoelectronic devices have shown that at given frequencies, e.g., at approximately 2.5 GHz, 8 GHz, 12 GHZ, 17.5 GHZ, and 21 GHz, sharp resonances occur. This indicates that a considerable part of the microwave power to be transported into the device is coupled to a package resonance, which leads to drastically increased or reduced back reflection and thus causes correspondingly sharp variations in the power applied to the device. In circuits for digital or broadband analog applications, such power variations are not tolerable.

SUMMARY OF THE INVENTION

Therefore, the technical problem to be solved by the invention is to provide a package wherein such package resonances are completely avoided or at least very highly attenuated.

According to the invention, this technical problem is solved by making the package, in whole or in part, of a microwave-absorbing, nonoutgassing material.

BEST MODE FOR CARRYING OUT INVENTION

Measurements on packages designed in accordance with the invention have shown that package resonances are virtually eliminated. The absorber materials should have a high purity and a specific conductivity $\sigma=1-10\ [1/\Omega\cdot m]$. In tests, silicon with a relative dielectric constant of 12 was used.

A suitable lining material are thin sheets of silicon. Such silicon sheets are commercially available. They are provided on one side with a metal layer, such as gold and/or tin, and can therefore be joined to the inner walls of a metal package by soldering. The lining may also be made of compounds of silicon and elements of the second period of the Periodic Table, such as silicon carbide, silicon nitride, and silicon oxides.

Another suitable lining material is a graphite foil as is offered by, for example, SGL Technik GmbH under the trade name "SIGRAFLEX". This foil can be attached to the inner surfaces of the package by means of a commercially available nonoutgassing adhesive. Because of its high thermal conductivity, graphite serves a dual function, namely as a microwave absorber and as a heatsink.

What is claimed is:

1. A package for microoptical and/or microelectronic devices so as to minimize the leakage of microwave electromagnetic radiation and which is nonoutgassing, comprising:

a lining formed from silicon sheets having a metal layer formed on one side of the silicon sheet, the metal layer formed from a metal which is suitable for soldering; and the outer portion of the package made from metal which is also suitable for soldering and which is joined to the metal layer of the liner by soldering.

2. A package as claimed in claim 1, characterized in that the lining is made of a silicon based compound containing silicon and elements of the second period of the Periodic Table.

3. A package for microoptical and/or microelectronic devices so as to minimize the leakage of microwave electromagnetic radiation and which is nonoutgassing, comprising:

a lining formed from graphite having a metal layer formed on one side of the graphite sheet, the metal layer formed from a metal which is suitable for soldering; and the outer portion of the package made from metal which is also suitable for soldering and which is joined to the metal layer of the liner by soldering.

4. A package as claimed in claim 2, wherein the silicon based compound is selected from the group consisting of silicon carbide, silicon nitride, and silicon oxides.

\* \* \* \* \*

UNITED STATES PATENT AND TRADEMARK OFFICE
CERTIFICATE OF CORRECTION

PATENT NO. : 6,054,766
DATED : April 25, 2000
INVENTOR(S) : Detlef Kaiser
Hans-Peter Hirler It is certified that error appears in the above-identified patent and that said Letters Patent is hereby corrected as shown below:

On the title page, item [75] Inventors:
"Detlev" should be --Detlef--.

Signed and Sealed this

Twenty-seventh Day of March, 2001

Attest:

NICHOLAS P. GODICI

Attesting Officer

Acting Director of the United States Patent and Trademark Office